US012682978B2

(12) United States Patent
Taylor et al.

(10) Patent No.: US 12,682,978 B2
(45) Date of Patent: Jul. 14, 2026

(54) SELF-CALIBRATION IN A MEMORY DEVICE

(71) Applicant: Micron Technology, Inc., Boise, ID (US)

(72) Inventors: Jennifer E. Taylor, Boise, ID (US);
Eric J. Stave, Meridian, ID (US);
Timothy M. Hollis, Meridian, ID (US);
Chulkyu Lee, Meridian, ID (US);
Chris Gregory Holub, Bath, PA (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 18/635,869

(22) Filed: Apr. 15, 2024

(65) Prior Publication Data

US 2024/0420790 A1 Dec. 19, 2024

Related U.S. Application Data

(60) Provisional application No. 63/507,948, filed on Jun. 13, 2023.

(51) Int. Cl.
*G11C 29/42* (2006.01)
*G11C 29/12* (2006.01)

(52) U.S. Cl.
CPC ........ *G11C 29/42* (2013.01); *G11C 29/12005* (2013.01); *G11C 29/1201* (2013.01)

(58) Field of Classification Search
CPC .............. G11C 29/42; G11C 29/12005; G11C 29/1201
See application file for complete search history.

(56) References Cited

U.S. PATENT DOCUMENTS

| | | | |
|---|---|---|---|
| 6,678,860 B1 | 1/2004 | Lee | |
| 8,942,319 B2 * | 1/2015 | Thakkar ............ | H04L 25/03063 |
| | | | 375/229 |
| 10,135,647 B2 * | 11/2018 | Zerbe ................ | H01L 21/76805 |
| 11,184,026 B2 | 11/2021 | Berman et al. | |
| 2017/0078118 A1 | 3/2017 | Chattopadhyay et al. | |
| 2019/0028236 A1 | 1/2019 | Tonietto et al. | |
| 2023/0072467 A1 | 3/2023 | Thiers et al. | |

OTHER PUBLICATIONS

International Search Report for PCT Application No. PCT/US2024/026863 mailed Aug. 20, 2024.

* cited by examiner

*Primary Examiner* — Vanthu T Nguyen
(74) *Attorney, Agent, or Firm* — Fletcher Yoder, P.C.

(57) ABSTRACT

Systems and methods include receiving data bits at an input pin of a semiconductor device from a host device. The received data is latched in latch circuitries of the semiconductor device that at least partially implements an equalizer to aid in interpreting the received data bits. A first latched bit latched from the first received bit of the received bits is transmitted from the latch circuitries to self-calibration circuitry. The first received bit is also latched in error evaluation circuitry as a second latched bit. The second latched bit is transmitted from the error evaluation circuitry to the self-calibration circuitry. The self-calibration circuitry determines settings for the equalizer without involving the host device in determining the settings after the host device sends the data bits.

20 Claims, 10 Drawing Sheets

SELF-CALIBRATION IN A MEMORY DEVICE

CROSS-REFERENCE TO RELATED APPLICATIONS

This application claims priority to U.S. Provisional Application No. 63/507,948, filed Jun. 13, 2023, entitled "Self-Calibration in a Memory Device," which is incorporated by reference herein in its entirety.

BACKGROUND

Field of the Invention

Embodiments of the present disclosure relate generally to the field of semiconductor memory devices. More specifically, embodiments of the present disclosure relate to a self-calibration and tracking in a dynamic random access memory (DRAM) device.

Description of the Related Art

The operational rate of memory devices, including the data rate of a memory device, has been increasing over time. As a side effect of the increase in speed of a memory device, data errors due to distortion may increase. For example, inter-symbol interference between transmitted data whereby previously received data influences the currently received data may occur (e.g., previously received data affects and interferes with subsequently received data). One manner to correct for this interference is through the use of a decision feedback equalizer (DFE) circuit, which may be programmed to offset (i.e., undo, mitigate, or offset) the effect of the channel on the transmitted data.

Additionally, correcting distortions in the transmitted signals continues to be important. One way to correct the distortions may be to use link training and subsequent re-training where the host device (e.g., processor) trains the link of double-data rate (DDR) interfaces between the DRAM devices and the host device. This link training/re-training includes the host device sending/receiving signals through the DDR interfaces while programming adjustments of interface-related parameters. However, link training time and subsequent retraining for the DDR interfaces of these DRAM devices may be relatively lengthy and negatively impact a user experience.

BRIEF DESCRIPTION OF THE DRAWINGS

Various aspects of this disclosure may better be understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, corrections for distortions of bits between a host device (e.g., processor) and a memory device may be performed by link training/re-training. However, such link training/re-training may be lengthy to complete and may negatively impact using the memory device. To at least partially mitigate negative impact, the memory device may be used to autonomously train the memory interface and/or autonomously adjust circuit parameters following a training to maintain an interface margin during operation of the memory device. As discussed below, this autonomous training and/or adjustment may factor in memory environment-specific complications, such as single-ended signaling, bursty data transmission (including related rapid power up and/or power down), relatively poor transistor performance, bi-directional pins, and/or other situations that may not be applicable to non-memory device calibration/training.

Figure 1:
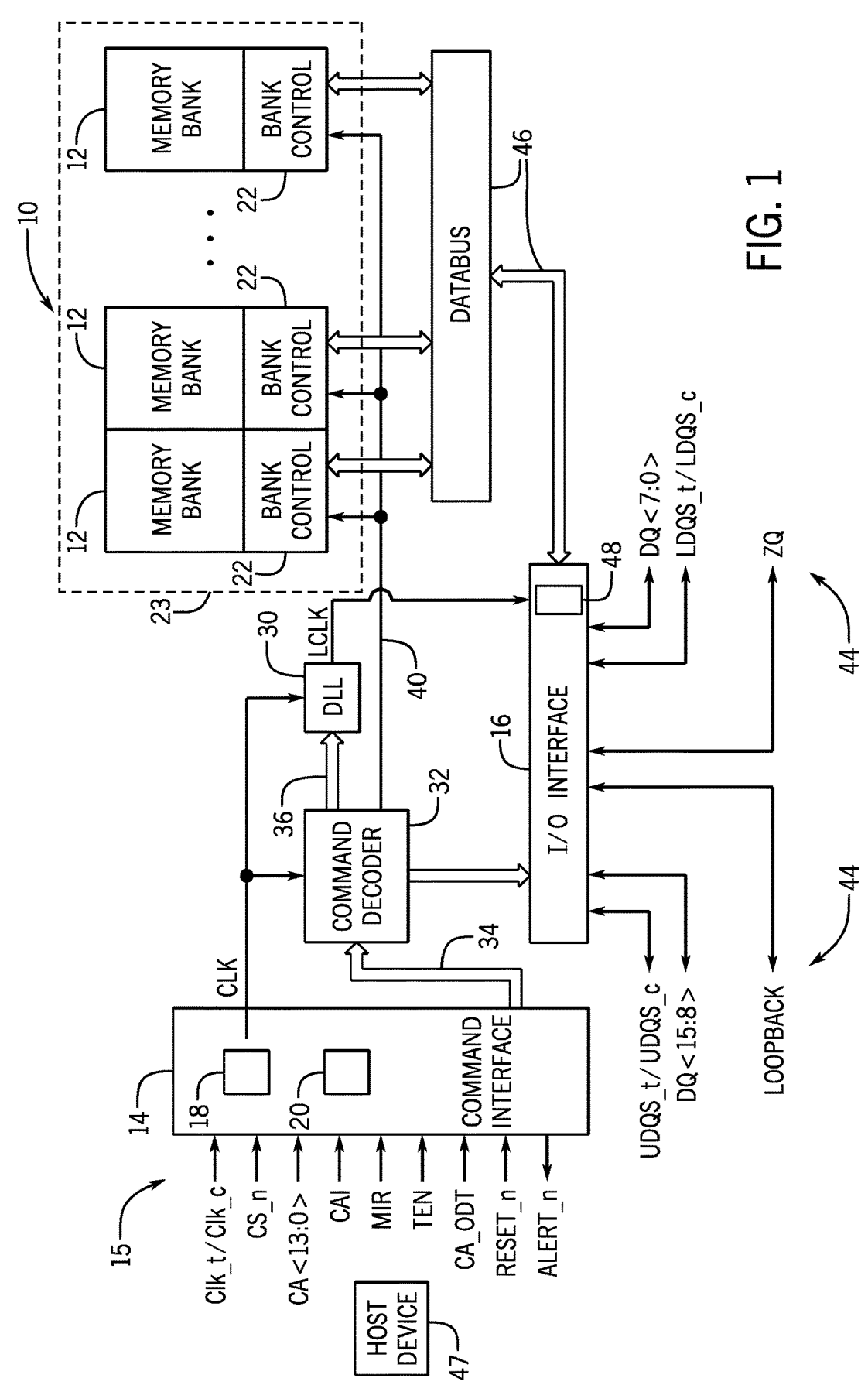
FIG. 1 is a simplified block diagram illustrating certain features of a memory device that includes an I/O interface having a data transceiver, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random-access memory (DDR5

SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder

32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over a data bus 46 that includes multiple bi-directional data connections. Data I/O signals, generally referred to as DQ signals, are generally transmitted and received in one or more bi-directional data connections. For certain memory devices, such as a DDR5 SDRAM memory device, the I/O signals may be divided into upper and lower bytes. For instance, for an x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

In some embodiments, the memory device 10 may be coupled to a host device 47. The host device 47 may include a processor, such as a central processing unit (CPU), a graphics processing unit (GPU), another microprocessor, a programmable logic device, and/or any other suitable processor that controls processing of system functions and requests. Further, any host device/processor may include multiple processing units.

The host device 47 may operate to transfer data to the memory device 10 for storage and may read data from the memory device 10 to perform various operations. Accordingly, to facilitate these data transmissions, in some embodiments, the I/O interface 16 may include a data transceiver 48 that operates to receive and transmit DQ signals to and from the I/O interface 16.

Figure 2:
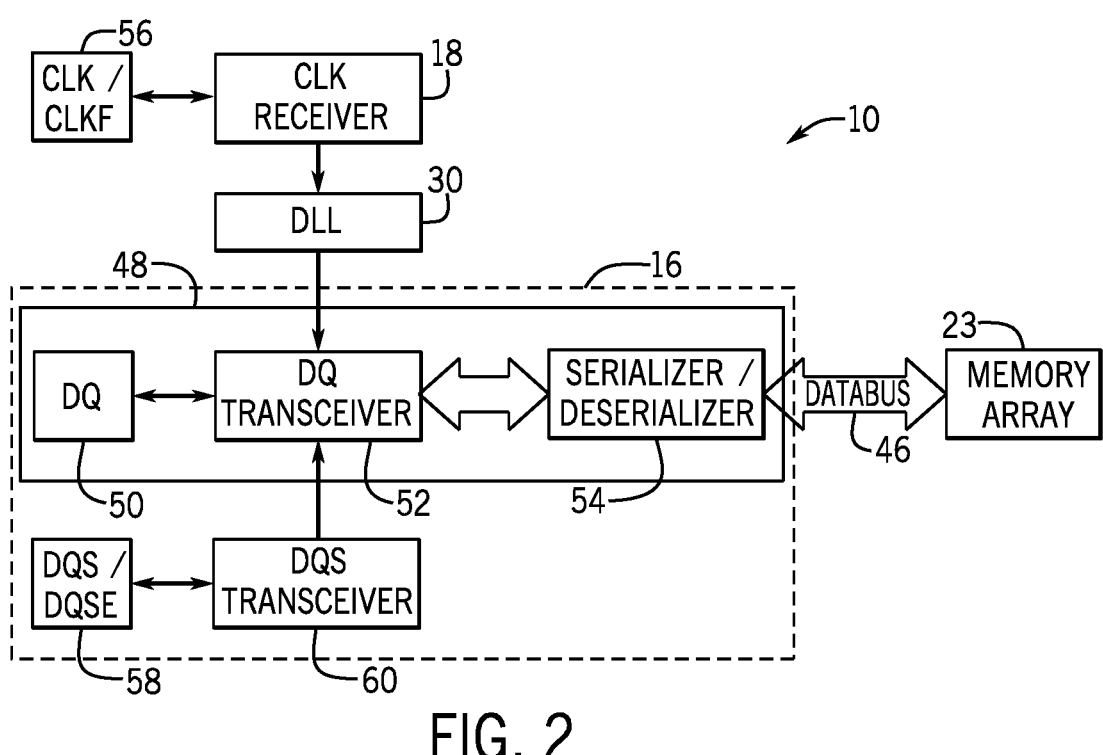
FIG. 2 illustrates a block diagram illustrating the data transceiver of FIG. 1 having a DQ transceiver, according to an embodiment of the present disclosure.

FIG. 2 illustrates the I/O interface 16 of the memory device 10 generally and, more specifically, the data transceiver 48. As illustrated, the data transceiver 48 of the I/O interface 16 may include a DQ connector 50 (e.g., any of DQ<7:0> and/or DQ<15:8>), a DQ transceiver 52, and a serializer/deserializer 54. It should be noted that in some embodiments, multiple data transceivers 48 may be utilized such that each single data transceiver 48 may be utilized in connection with a respective one of each of upper and lower I/O signals (e.g., DQ<15:8> and DQ<7:0>) corresponding to upper and lower bytes of the data signals, for instance. Thus, the I/O interface 16 may include a plurality of data transceivers 48, each corresponding to one or more I/O signals (e.g., inclusive of a respective DQ connector 50, DQ transceiver 52, and serializer/deserializer 54).

The DQ connector 50 may include pins, pads, lines, other types of interfaces, and/or a combination thereof that operates to receive DQ signals from the host device 47 as part of an operation (e.g., a data write operation). Additionally, the DQ connector 50 may be used to transmit DQ signals from the memory device 10 to the host device 47 as part of an operation (e.g., data read operation). To facilitate these data reads/writes, a DQ transceiver 52 in data transceiver 48 may determine timing of the transmissions via a received clock signal generated by the internal clock generator 30. The clock signal transmitted by the internal clock generator 30 may be based upon one or more clocking signals received by the memory device 10 from the host device 47 at a clock connector 56 and routed to the internal clock generator 30 via the clock input circuit 18.

The DQ transceiver 52 of FIG. 2 may also receive one or more DQS signals to assist in capturing data in the DQ signals. The DQS signals may be received at a DQS connector from the host device 47 that are routed to the DQ transceiver 52 via a DQS transceiver 60. The DQS transceiver 60 operates to control selective transmission of the DQS signals to the DQ transceiver 52. Thus, the DQ transceiver 52 may receive DQS signals to assist in a data write operation.

In addition, as illustrated in FIG. 2, the data transceiver 48 also includes a serializer/deserializer 54 that operates to translate serial data bits (e.g., a serial bit stream) into a parallel data bits (e.g., a parallel bit stream) for transmission along data bus 46 during data write operations of the memory device 10. Likewise, the serializer/deserializer 54 operates to translate parallel data bits (e.g., a parallel bit stream) into serial data bits (e.g., a serial bit stream) during read operations of the memory device 10. In this manner, the serializer/deserializer 54 operates to translate data received from the host device 47 in a serial format into a parallel format for transmission over the data buses 46. Likewise, the serializer/deserializer 54 operates to translate data received from the data buses 46 in a parallel format into a serial format suitable for transmission to the host device 47.

Figure 3:
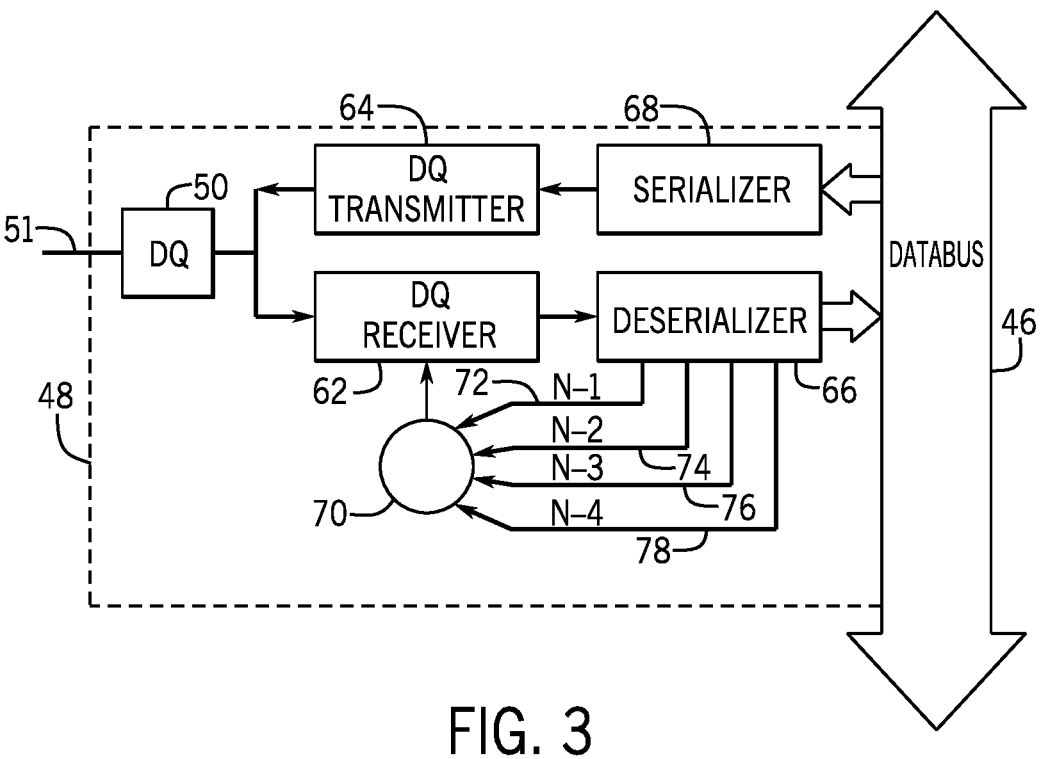
FIG. 3 illustrates a block diagram of an embodiment of the data transceiver of FIG. 1 having a DQ receiver that includes a decision feedback equalizer (DFE), according to an embodiment of the present disclosure.

As may be appreciated, the serializer/deserializer 54 and the DQ transceiver 52 may contain internal distinct circuitries such that a DQ receiver may be coupled to a serializer and a DQ transmitter may be coupled to a deserializer (or parallelizer). For example, FIG. 3 illustrates the data transceiver 48 as including the DQ connector 50, a DQ receiver 62, a DQ transmitter 64, a deserializer 66, and a serializer 68. In operation, the host device 47 transmits data in a serial form to the data transceiver 48 as part of an operation (e.g., write). This data is received at the DQ connector 50 and transmitted to the DQ receiver 62. The DQ receiver 62 may perform one or more operations on the data (e.g., amplification, driving of the data signals, etc.) and/or may operate as a latch for the data until reception of a respective DQS signal that operates to coordinate the transmission of the data to the deserializer 66. As part of the operation, the deserializer 66 converts data from a serial format into a parallel format for transmission via the data bus 46.

Likewise, during another operation (e.g., read), the serializer 68 may receive data in a parallel format from the data bus 46 and convert it to a serial format transmitted to the DQ transmitter 64. The DQ transmitter 64 may perform one or more operations on the data (e.g., amplification/de-amplification, driving of the data signals, etc.). Additionally or alternatively, the DQ transmitter 64 may operate as a latch for the received data until reception of a respective clock signal from the internal clock generator 30, that operates to coordinate (e.g., control) the transmission of the data to the DQ connector 50 for transmission along a data transfer bus 51 to one or more components of the host.

In some embodiments, the data received at the DQ connector 50 may be distorted. For example, data received at the DQ connector 50 may be affected by inter-symbol interference (ISI) in which previously received data interferes with subsequently received data. For example, due to higher frequencies of transmissions across the data transfer bus 51 to the DQ connector 50, the data received at the DQ connector 50 may be distorted relative to the data transmitted by the host device 47. One technique to mitigate this distortion is to apply equalization to the data using an equalizer.

The data transceiver 48 includes a decision feedback equalizer (DFE) 70 as an equalizer, but may include other equalizers, such as a continuous-time linear equalizer (CTLE), a feed-forward equalizer (FFE), and/or any other suitable equalizer types. Furthermore, the training techniques discussed herein may be applied to any suitable equalizers, input-offset training/calibration, output driver training, and the like. Output driver training may be based on information extracted from received signals. For instance, the information may include tuning drive strength, termination strength, Feed-forward (FFE) tap coefficients, pre-/de-emphasis equalization settings, and the like. Furthermore, although the discussion generally relates to magnitude and sign of the tap coefficients, location in time for the taps may be determined for a DFE "sliding time." The sliding tap timing may be synchronous with a bit unit interval or continuous. In some embodiments, the continuous nature may be turned on and off (e.g., using a mode register value).

As illustrated, the DFE 70 is a multi-tap (e.g., four-tap) DFE 70. However, fewer or more than four taps may be utilized in the DFE 70. Likewise, the DFE 70 may be disposed separate from or internal to the deserializer 66 or the DQ receiver 62. In operation, a binary output (e.g., from a latch or decision-making slicer) is captured in one or more data latches or data registers. In the present embodiment, these data latches or data registers may be disposed in the deserializer 66 with the latched values transmitted back as taps of the DFE 70 along paths 72, 74, 76, and 78.

When a data bit is received at the DQ receiver 62, it may be identified as being transmitted from the host as bit "n" and may be received at a time to as distorted bit n (e.g., bit n having been distorted by ISI). A currently received bit (N) may be preceded by bits from previous cycles (and/or half-cycles) N–4 (four bits ago), N–3 (three bits ago), N–2 (two bits ago), and N–1 (the previous bit). The latched bits N–1, N–2, N–3, and N–4 are used by the DFE 70 to mitigate the distortion of the transmitted bit N. These latched bits are fed back along paths 72, 74, 76, and 78 to the DFE 70. The DFE 70 applies the latched bits using generate weighted taps that are added to the input signal. Additionally or alternatively, the weighted taps (e.g., voltages) may be combined with an initial reference value to generate an offset that mitigates the distortion of data.

Figure 5A:
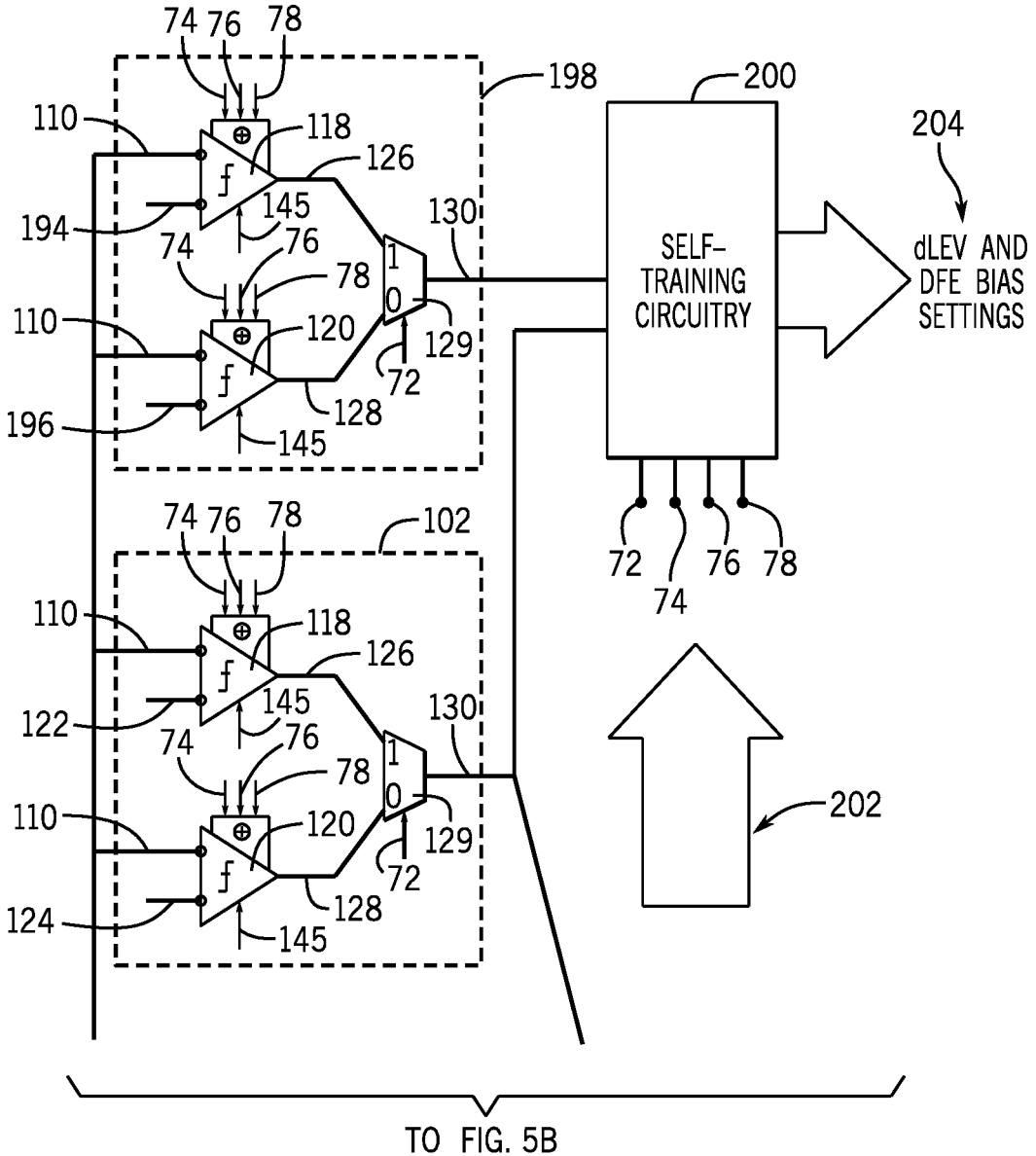
FIGS. 5A and 5B illustrate a circuit diagram of a distortion correction circuit of the DFE of the DQ receiver of FIG. 3 with an error evaluation sub-circuit and self-calibration circuitry, according to an embodiment of the present disclosure.
Figure 5B:
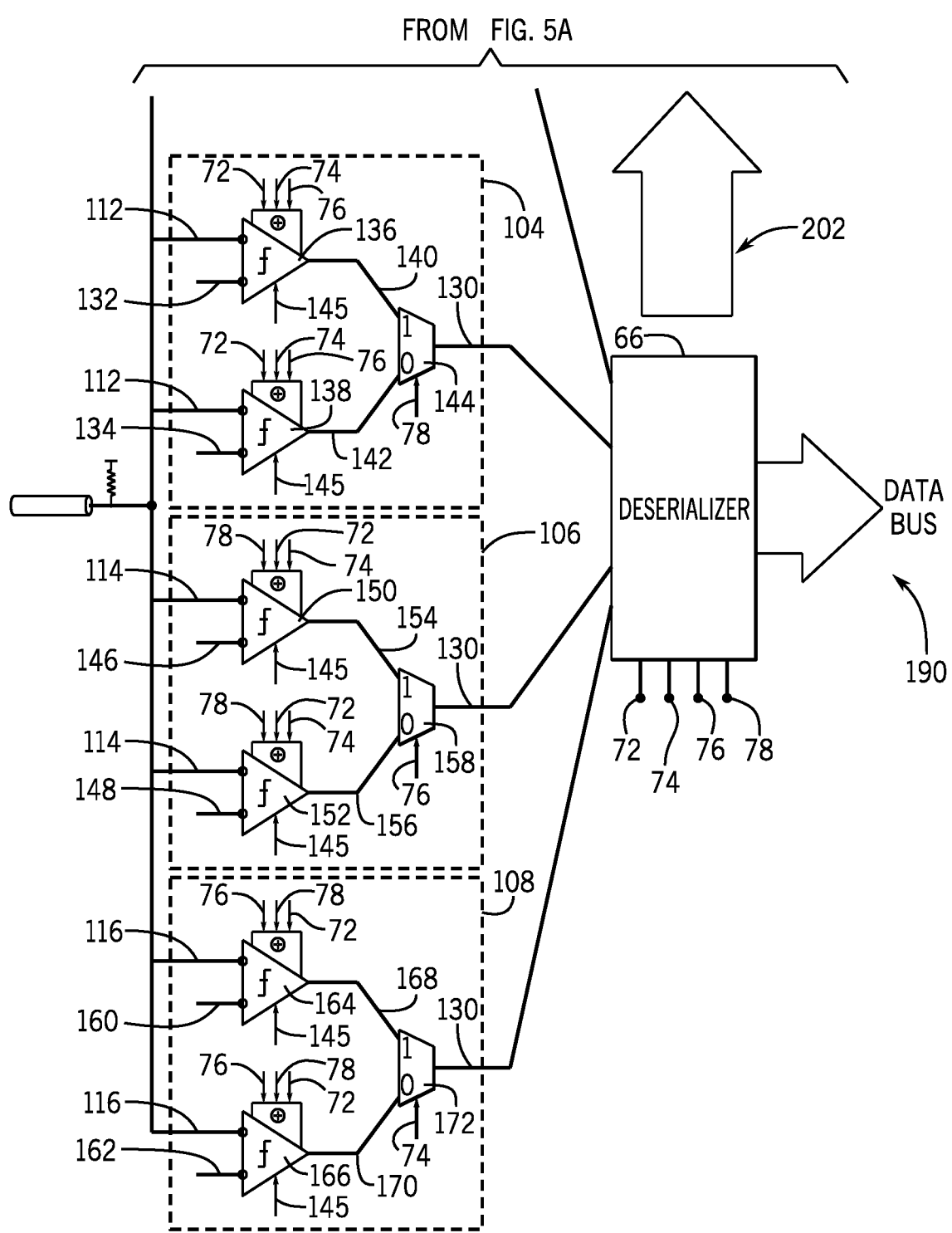

FIGS. 5A and 5B illustrate a distortion correction circuit 100 that may be part of the DFE 70 and that is configured to process and correct four bits. Additionally or alternatively, at least some of the functions and/or circuitry of the distortion correction circuit 100 may be located in a data buffer chip between the host device 47 and the memory device 10. As used herein, the distortion correction circuit 100 may also be referred to as error evaluation circuitry, error detection circuitry, error correction circuitry, and the like. The distortion correction circuit 100 includes the first sub-circuit 102, a second sub-circuit 104, a third sub-circuit 106, and a fourth sub-circuit 108 that may each be latching circuitry comprising one or more latches configured to latch input data 110 of corresponding clock phases. Furthermore, in some embodiments, the memory device 10 may divide a clock into different phases and control operations (e.g., writes) using different phases for successive bits. In such embodiments, the first sub-circuit 102 may correspond to a first phase and may process a first bit and every fourth bit (e.g., $5^{th}$ bit, $9^{th}$ bit, etc.) after the first bit in the operation. Likewise, the second sub-circuit 104 may correspond to a second phase and may process a second bit and every fourth bit after the second bit (e.g., $6^{th}$ bit, $10^{th}$ bit, etc.) in the operation. Similarly, the third sub-circuit 106 may correspond to a third phase and may process a third bit and every fourth bit after the third bit (e.g., $7^{th}$ bit, $11^{th}$ bit, etc.) in the operation, and the fourth sub-circuit 108 may correspond to a fourth phase and may process a fourth bit and every fourth bit after the fourth bit (e.g., $8^{th}$ bit, $12^{th}$ bit, etc.) of the operation. The first sub-circuit 102 may receive an input bit 110 (e.g., from the data transfer bus 51). Likewise, second sub-circuit 104 may receive an input bit 112. The third sub-circuit 106 may receive an input bit 114, and the fourth sub-circuit 108 may receive an input bit 116.

To elaborate further, the first sub-circuit 102 may receive the input bit 110 and may begin to process it using the previous bit or weighted tap data transmitted along the paths 74, 76, and 78 to calculate the values to be used by the latches (or equalizers) 118 and 120. The latches implement taps 2-4 by applying current subtraction using the values carried along the paths 74, 76, and 78. The voltage reference signals 122 (VRHI) and 124 (VRLO) may represent a modified DQ reference signal having been adjusted for the contribution of a bit value for N–1 being logically high and low, respectively. In other words, either possible value (e.g., 0 or 1) of the most recent bit value may be calculated in parallel (i.e., unrolled) since the delay in propagation of the most recent bit to the latches 118 and 120 may be too late to equalize properly. Outputs 126 and 128 to the selection device 129 may be transmitted on the rising (or falling) edge of the DQS signal. A selection device 129 may use the actual N–1 bit value stored in the deserializer 66 to select between the parallel operations assuming either the high value or the low value of the N–1 bit to determine the correct value for the corrected bit 130 value takes. In other words, the selection device 129 selects the value of the corrected bit 130 from the output 126 or the output 128.

The inputs used for the determination of the corrected bit 130 for the second sub-circuit 104 may be different from the inputs for the first sub-circuit 102, but the second sub-circuit 104 may function similarly to the first sub-circuit 102. For instance, the second sub-circuit 104 may receive the input bit 112 and may begin processing the input bit 112 with the most recent bit unrolled. Thus, the voltage reference signal 132 operates as a logical high reference (VRHI) assuming the most recent bit for the second sub-circuit is a logic high, and the voltage reference signal 134 operates as a logical low reference (VRLO) assuming the most recent bit is a logic low. The method described with the first sub-circuit 102 may be used to correct the input bit 112 except that the previous bit or weighted tap data transmitted along the paths 72, 74, and 76 are used to calculate the values to be used to provide a correction via the equalizers 136 and 138. Outputs 140 and 142 to a selection device 144 may be transmitted on the rising (or falling) edge of a DQS signal 145 (e.g., UDQS_t, UDQS_c, LDQS_t, and/or LDQS_c). The selection device 144 for the second sub-circuit 104 may use the bit value stored in the deserializer 66 for transmission along path 78 to make the final decision on the value of the corrected bit 130 corresponding to the input bit 112.

The inputs used for the determination of the corrected bit 130 for the third sub-circuit 106 may be different from the inputs for the second sub-circuit 104, but the third sub-circuit 106 may function similarly to the second sub-circuit 104. For instance, the third sub-circuit 106 may receive the input bit 114 and may begin processing of the input bit 114 with a previous bit (e.g., along path 76) being unrolled. To this purpose, the voltage reference signal 146 (VRHI) corresponds to a logical high, and the voltage reference signal 148 (VRLO) corresponds to a logical low. The method described with the first sub-circuit 102 may be used to correct the input bit 114 except that the previous bit or weighted tap data transmitted along the paths 72, 74, and 78 may be used to calculate the values used to provide a correction via equalizers 150 and 152. Outputs 154 and 156 to a selection device 158 may be transmitted on the rising (or falling) edge of the DQS signal 145. The selection device 158 for the third sub-circuit 106 may use the bit value stored in the deserializer 66 for transmission along path 76 to make the final decision on the value of the corrected bit 130 of the input bit 114.

The inputs used for the determination of the corrected bit 130 for the fourth sub-circuit 108 may be different from the inputs for the third sub-circuit 106, but it may function similarly to the third sub-circuit 106. The fourth sub-circuit 108 may receive the input bit 116 and begin processing of the input bit 116 with a bit (e.g. corresponding to path 74) being unrolled. To this purpose, the voltage reference signal 160 (VRHI) corresponds to a logical high, and the voltage reference signal 162 (VRLO) corresponds to a logic low. The method described with the first sub-circuit 102 may be used to correct the input bit 116 except that the previous bit or weighted tap data transmitted along the paths 72, 76, and 78 may be used to calculate the values used to provide a correction via the equalizers 164 and 166. Outputs 168 and 170 to the selection device 172 may be transmitted on the rising (or falling) edge of the DQS signal 145. The selection device 172 for the fourth sub-circuit 108 may use the bit value stored in the deserializer 66 for transmission along the path 74 to make a final decision on the value of the corrected bit 130 of the input bit 116.

The output from the selection devices 129, 144, 158, and 172 are transmitted to the deserializer 66 at the conclusion of each final decision on the respective corrected bits 130. In the deserializer 66, the latched values are updated in accordance with the corrected bit 130 data. It may be noted that the corrected bit 130 may not have completed transmission to the deserializer 66, nor updated values stored for transmission along the paths 72-78 prior to the reception of a fifth input bit, thus the method of delaying the final selection of the corrected bit 130 may be continued. Thus, the first sub-circuit 102 may apply weighted values from the fourth sub-circuit 108 in parallel until the corrected bit 130 is determined from the fourth sub-circuit 108 and used as a selection bit for the first sub-circuit 102. Similarly, the second sub-circuit 104 may apply weighted values from the first sub-circuit 102 in parallel until the corrected bit 130 is determined from the first sub-circuit 102 and is used as a selection bit for the second sub-circuit 104. Likewise, the third sub-circuit 106 may apply weighted values from the second sub-circuit 104 in parallel until the corrected bit 130 is determined from the second sub-circuit 104 and is used as a selection bit for the third sub-circuit 106. The fourth sub-circuit 108 may apply weighted values from the third sub-circuit 106 in parallel until the corrected bit 130 is determined from the third sub-circuit 106 and is used as a selection bit for the fourth sub-circuit 108.

Figure 4:
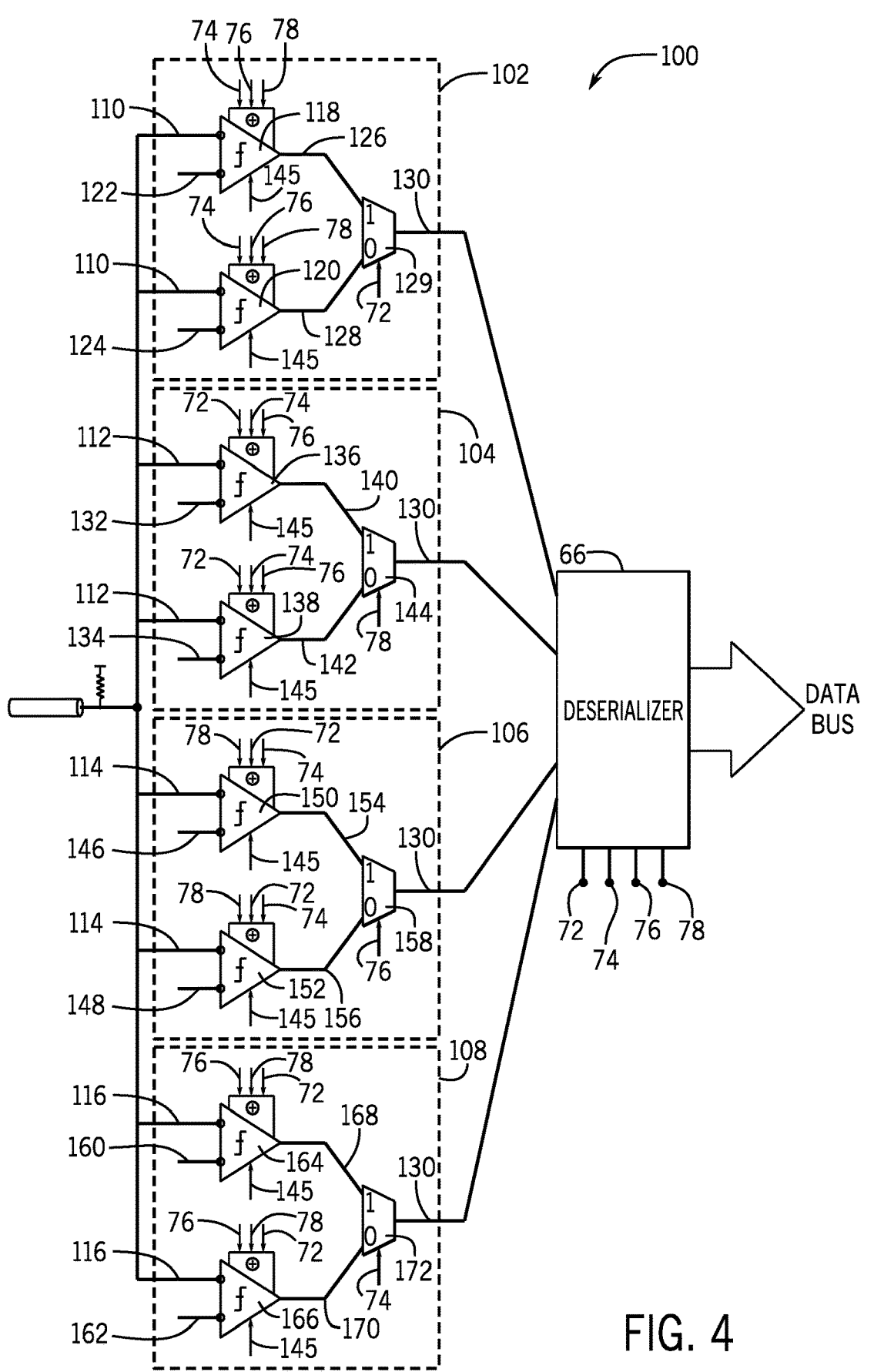
FIG. 4 illustrates a circuit diagram of a distortion correction circuit of the DFE of the DQ receiver of FIG. 3, according to an embodiment of the present disclosure.

As previously noted, the memory device 10 may include self-training and/or circuitry adjustments to maintain link integrity without host device 47 interaction and/or with reduced host device 47 interaction. For instance, FIGS. 5A and 5B show a distortion correction circuit 190 that may be part of the DFE 70. The distortion correction circuit 190 of FIGS. 5A and 5B may function similar to the description of the distortion correction circuit 100 of FIG. 4 except that the distortion correction circuit 190 uses programmable reference voltages 194 and 196 in an error evaluation sub-circuit 198. The programmable reference voltages 194 and 196 may both be based on a new programmable reference level ("dLev") that is then unrolled for logic high as the programmable reference voltage 194 and for logic low as the programmable reference voltage 196 like the reference levels are unrolled for voltage reference signals 122 and 124 for high and low values as discussed above. For instance, the programmable reference voltage 194 may be the dLev after adjustment by a tap adjustment assuming that the previous bit was high, and the programmable reference voltage 196 may be the dLev after adjustment by a different tap adjustment assuming that the previous bit was low.

The error evaluation sub-circuit 198 may be another instance of any of the sub-circuits 102, 104, 106, or 108 except that the latches (e.g., latches 118 and 120) of the error evaluation sub-circuit 198 use different programmable reference voltages 194 and 196 than used in the respective sub-circuit (e.g., first sub-circuit 102). In the illustrated embodiment, the error evaluation sub-circuit 198 performs analysis of the input bit 110 in parallel with the first sub-circuit 102 using another instance of the latches 118 and 120 and using additional copies of the latches, multiplexers, inputs, clocks, routing, and taps that are used in the first sub-circuit 102. However, the error evaluation sub-circuit 198 may send its corrected bit 130 to self-calibration circuitry 200 rather than to the deserializer 66. The self-calibration circuitry 200 (or self-training circuitry) receives the corrected bit 130 from the error evaluation sub-circuit 198 and the corrected bit 130 from the first sub-circuit 102 along with the tap adjustments via paths 72, 74, 76, and 78. These tap adjustments may be received from the deserializer 66 via a bus 202 from the serializer. In response to the corrected bit 130 from the error evaluation sub-circuit 198 and the corrected bit 130 from the first sub-circuit 102, the self-calibration circuitry 200 may transmit an output 204 that includes settings for the dLev. The output 204 may also include DFE settings used to control the DFE to maintain link integrity between the host device 47 and the memory device 10. As discussed below in relation to FIG. 9, the self-calibration circuitry 200 enables the memory device 10 to self-train/self-level the bias levels for the DFE. Self-training/self-calibration may be performed without ongoing supervision by the host device 47. In some embodiments, the host device 47 may initiate the calibration/training and/or send a data pattern and clock signal(s), but the memory device 10 may control the dLev and the DFE bias settings from the pattern of data and clock signal(s).

As illustrated, since the error evaluation sub-circuit 198 is another instance of the first sub-circuit 102, the error evaluation sub-circuit 198 uses the same clock phases and tap adjustments at respective latches and/or multiplexers. Additionally or alternatively, the error evaluation sub-circuit 198 may be an instance of any of the other sub-circuits 104, 106, and 108 to analyze other corresponding bits using corresponding clocks and tap adjustment routing. In some embodiments, the error evaluation sub-circuit 198 may rotate between different tap points. The error evaluation sub-circuit 198 may be used to train a first bit during a first training and may be used to train a second bit during a second training. During the second training, the error evaluation sub-circuit 198 may use different tap connections corresponding to a latch corresponding to the second bit. In other embodiments, the error evaluation sub-circuit 198 may be used to train using the first bit but may apply the resulting DFE settings to other taps in a group including the first bit (e.g., taps 1-4).

Figure 6:
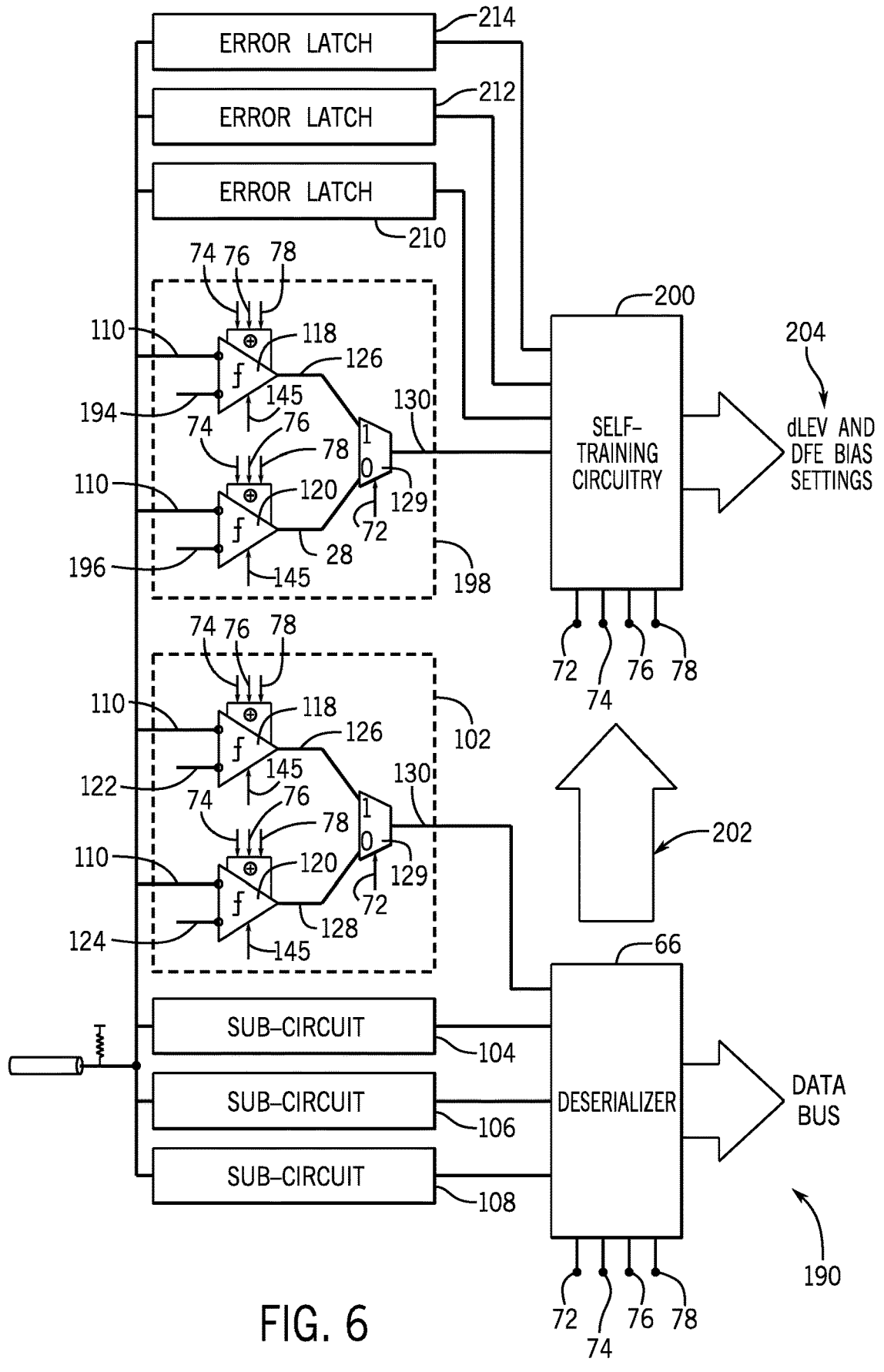
FIG. 6 illustrates a circuit diagram of a distortion correction circuit of the DFE of the DQ receiver of FIG. 3 with multiple error evaluation sub-circuits and self-calibration circuitry, according to an embodiment of the present disclosure.

Additionally or alternatively, in some embodiments of the distortion correction circuit 190 may include multiple error evaluation sub-circuits. For instance, FIG. 6 is a simplified circuit diagram of an embodiment of the distortion correction circuit 190 that includes the sub-circuits 102, 104, 106, and 108 and the error evaluation sub-circuit 198 along with additional error evaluation sub-circuits 210, 212, and 214. As the error evaluation sub-circuit 198 corresponds to the sub-circuit 102, the error evaluation sub-circuits 210, 212, and 214 may correspond to the respective sub-circuits 104, 106, and 108. In other words, the error evaluation sub-circuit 210 may be another instance of the sub-circuit 104 and may use the same clock phases and tap adjustments as the sub-circuit 104 at its respective latches and/or multiplexers. Similarly, the error evaluation sub-circuit 212 may be another instance of the sub-circuit 106 and may use the same clock phases and tap adjustments as the sub-circuit 106 at its respective latches and/or multiplexers. Likewise, the error evaluation sub-circuit 214 may be another instance of the sub-circuit 108 and may use the same clock phases and tap adjustments as the sub-circuit 108 at its respective latches and/or multiplexers. As may be appreciated, the distortion correction circuit 190 of FIG. 6 may provide more parallel computation of the self-training outputs but may consume more power than the distortion correction circuit 190 of FIGS. 5A and 5B.

Figure 7:
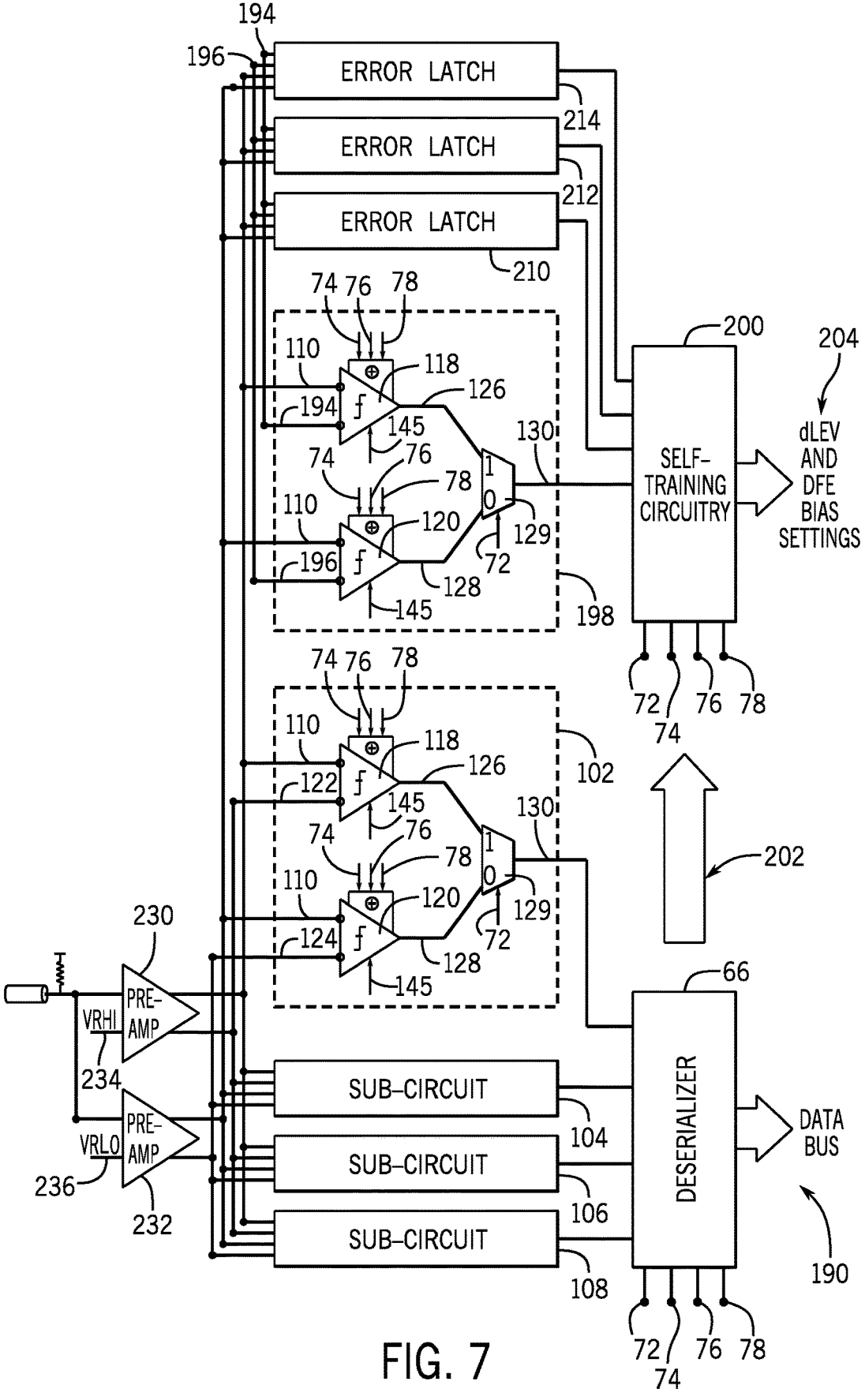
FIG. 7 illustrates a circuit diagram of a distortion correction circuit of the DFE of the DQ receiver of FIG. 3 with pre-amplifiers driving multiple error evaluation sub-circuits and also includes self-calibration circuitry, according to an embodiment of the present disclosure.

In some embodiments of the memory device 10, DQ receiver 62 may include pre-amplification of the DQ signals. For instance, FIG. 7 shows an embodiment of the distortion correction circuit 190 that includes pre-amps 230 and 232 that couple to the DQ pad rather than the DQ pad coupling directly to latches of the sub-circuits 102, 104, 106, and 108. Even with use of the pre-amps 230 and 232, tap1 may still be unrolled only that the voltage reference signals 122 and 124 have gone through the respective pre-amps 230 and 232 first. The pre-amp 230 receives a voltage reference high (VRHI) signal 234 that corresponds to a previous bit being high and is used to generate the voltage reference signal 122 from the amplifier. Similarly, the pre-amp 232 receives a voltage reference low (VRLO) signal 236 that corresponds to the previous bit being low and is used to generate the voltage reference signal 124.

Furthermore, the pre-amps 230 and 232 may also be used on the input bit 110. For instance, the pre-amps 230 and 232 may include variable gain adjustments and/or continue time linear equalization. Here, since the pre-amplifiers 230 and 232 receive the VRHI signal 234 and the VRLO signal 236, the input bits 110 supplied to the latches (e.g., latch 118) corresponding to a high previous bit may be different than the input bits 110 supplied to the latches (e.g., latch 120) corresponding to a low previous bit. Therefore, as illustrated, the pre-amps 230 and 232 may use different buses to transmit the respective input bits 110 to the respective latches. The remaining portions of the distortion correction circuit 190 of FIG. 7 operate similar to the distortion correction circuits 190 of FIGS. 5 and 6.

Figure 8:
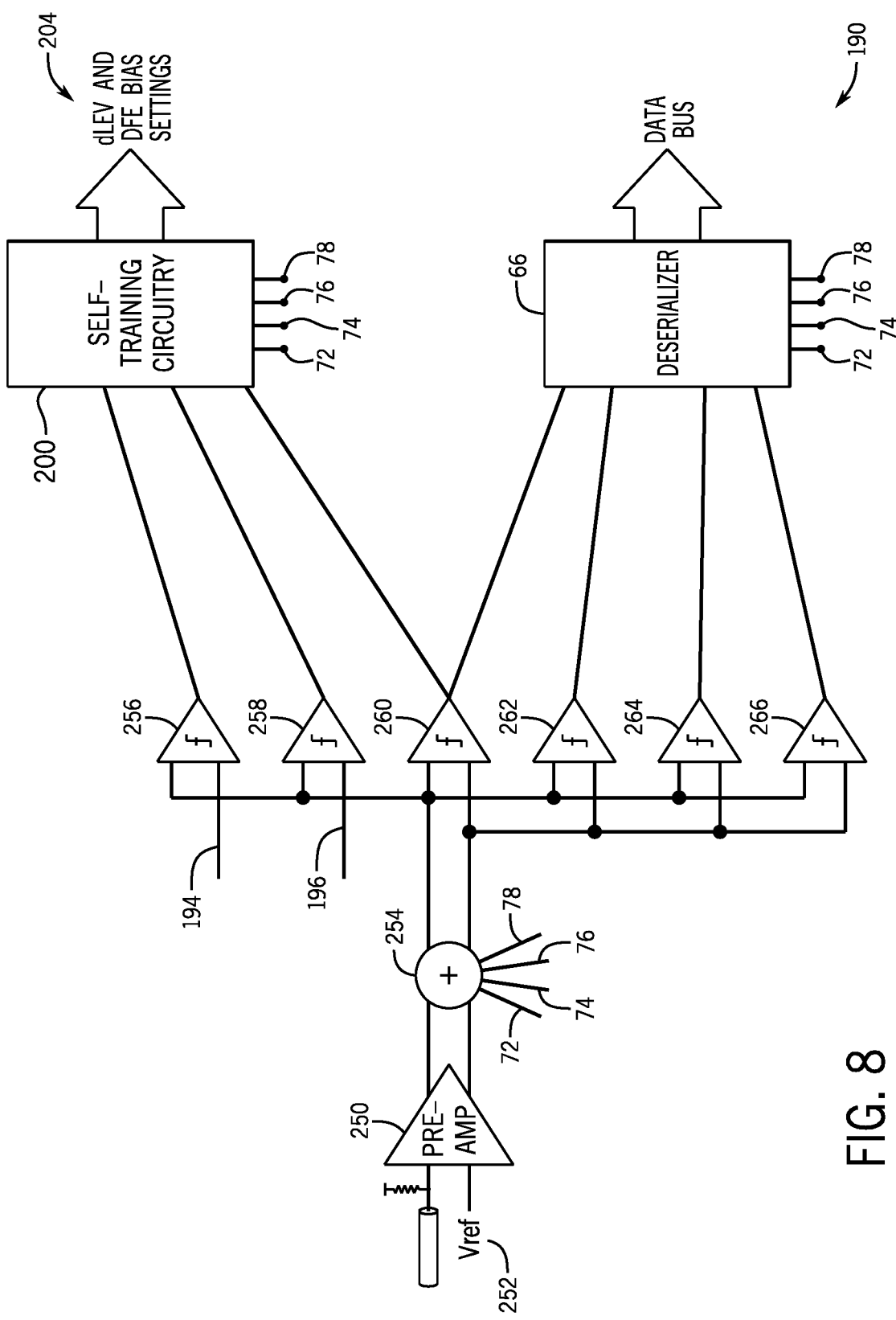
FIG. 8 illustrates a circuit diagram of a different embodiment of the distortion correction circuit of the DFE of the DQ receiver of FIG. 3 with self-calibration circuitry, according to an embodiment of the present disclosure.

Although the foregoing discusses specific configurations of the DQ receiver 62 and their distortion correction circuits 190, any suitable configuration of the DQ receiver 62 may be used for self-training/self-calibration. For instance, FIG. 8 shows an embodiment of the distortion correction circuit 190 that does not unroll the tap 1 and uses separate equalizers 254 and latches 256, 258, 260, 262, 264, and 266. The latch 260 corresponds to the latch 118 that uses a first clock phase (and every $4^{th}$ bit thereafter) to capture equalized data from the equalizer 254 from a pre-amp 250 based on a reference voltage (Vref) 252. Similarly, the latch 262 uses a second clock phase (and every $4^{th}$ bit thereafter), the latch 264 uses a third clock phase (and every $4^{th}$ bit thereafter), and the latch 266 uses a fourth clock phase (and every $4^{th}$ bit thereafter). The latches 260, 262, 264, and 266 also receive a pre-amped version of reference voltage 252. The latches 256 and 258 are similar to the respective latches 118 and 120 and use the programmable reference voltages 194 and 196 to compare to the data from the pre-amp 250 with tap 1 unrolled. The remainder of the distortion correction circuit 190 of FIG. 8 functions similar to the distortion correction circuits 190 of FIGS. 5-7 discussed previously. Furthermore, although the foregoing embodiments discuss four-phase receivers, other implementations of the teachings herein may include any numbers of phases (e.g., 8-phases) with any number of suitable DFE taps.

Figure 9:
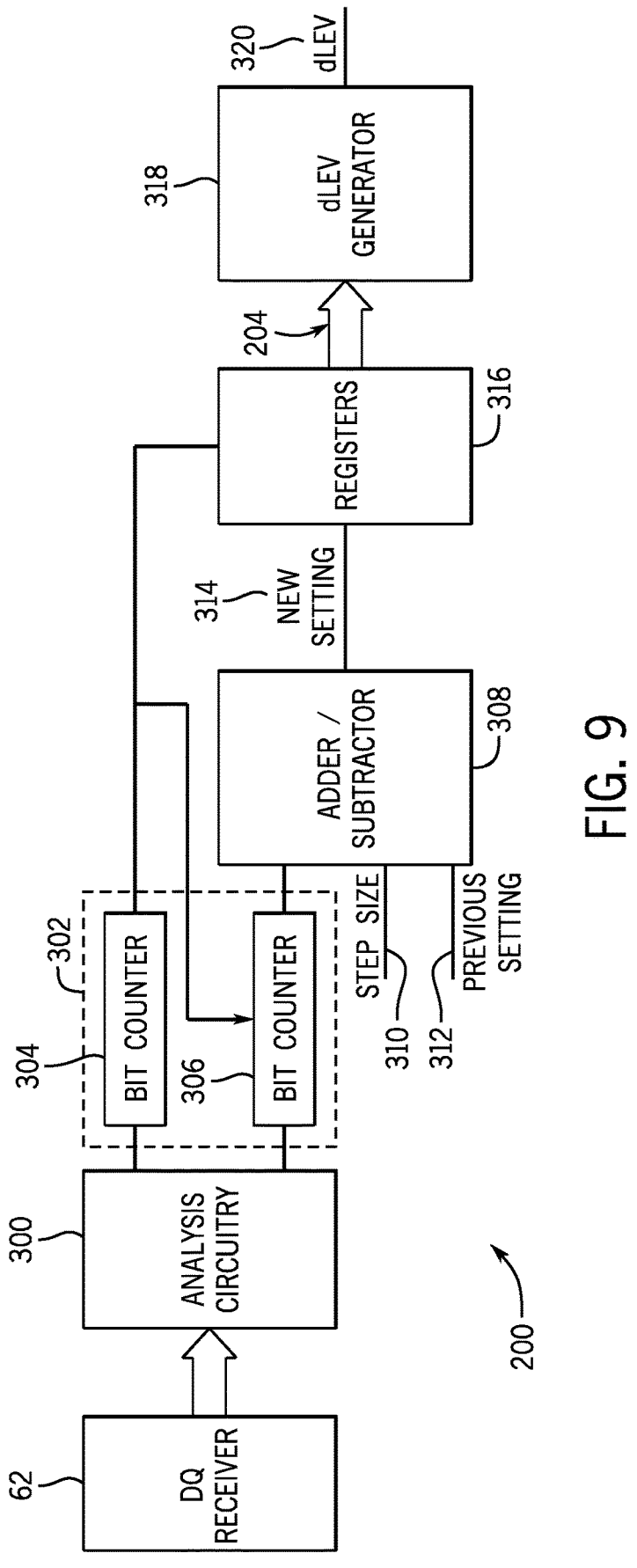
FIG. 9 illustrates a block diagram of the self-calibration circuitry of FIGS. 5, 6, 7, and 8, according to an embodiment of the present disclosure.

FIG. 9 is a block diagram of an embodiment of the error evaluation sub-circuit 198. As previously noted, the DQ receiver 62 (that includes the distortion correction circuit 190) transmits a current data bit state, an error bit state, and feedback bits to analysis circuitry 300. The analysis circuitry 300 may include digital logic circuitry (e.g., NAND gates, inverters, OR gates, etc.). The analysis circuitry 300 receives the current data bit state, error bit state, and feedback bits and compares the received bits. Based on the comparison of the current data bit state, the error bit state, and/or the feedback bits, the analysis circuitry 300 may determine that a condition is met (e.g., error bit state and current data bit state match) and make an increment decision to increment a count. When the condition is not met, the analysis circuitry 300 may determine whether to decrement or not increment the count.

The analysis circuitry 300 may be coupled to averaging circuitry 302. The averaging circuitry 302 may be digital averaging circuitry since in some embodiments analog averaging circuitry may be unsuitable for such usage due at least in part to the burst-heavy nature of transmissions for at least some memory operations where analog averaging circuitry may generally require a continuous data stream. The analysis circuitry 300 may increment a bit counter 304 when any decision (increment or no increment) is made and may increment a bit counter 306 when an increment decision is made. When a threshold number (e.g., 1,024) of bits has been counted in the bit counter 304, it may output a stop signal to stop counting in the bit counter 306. When the counting is stopped via the bit counter 304, the bit counter 306 outputs an indication of whether a proportional threshold (e.g., greater than some proportion of) of the bits counted corresponded to the incrementations counted in the bit counter 306 due to the condition being met for the corresponding bits. For example, the proportional threshold may correspond to at least 512 incrementations that is greater than or equal to half of the number of total bits counted when the total number of bits counted in the bit counter 304 is 1,024. In some embodiments, there may be more than one single proportional threshold that each corresponds to different output values such that the highest (or lowest) threshold crossed determines that output value. For instance, the output value may correspond to an indication to add more voltage for dLev, lower the voltage level of dLev, and/or leave dLev the same.

The number of bits to be counted before determining an addition or subtraction decision is made may be set by the host device 47 (e.g., via setting a mode register). This dynamic nature would enable the host device 47 to reduce the training time for less complex channel responses. Additionally or alternatively, the number of bits may be set by fuse-controlled configurations.

The output of the bit counter 306 is transmitted to an adder/subtractor circuitry 308. The adder/subtractor circuitry 308 also receives a step size signal 310 that may be one or more bits that indicate a size of a step from a previous setting signal 312 for the dLev. In other words, the previous setting signal 312 may indicate a previous voltage level for the dLev (e.g., 50 mV) while the step size signal 310 indicates how much to change the dLev (e.g., 5 mV) in a direction based on the output of the bit counter 306. In some embodiments, the step size signal 310 may be based on the proportional threshold determined in the bit counter 306. An output of the adder/subtractor circuitry 308 may indicate a new setting 314 for the dLev. For instance, if the output of the bit counter 306 indicates an addition, the step size signal 310 indicates 5 mV, and the previous setting signal 312 indicates 50 mV, the new setting 314 would indicate 55 mV. The new setting 314 may be stored in registers 316 and/or latched out as the dLev setting based on the completion of the count to the threshold in the bit counter 304. As illustrated, the output 204 (e.g., dLev setting) is input to dLev generator circuitry 318 that receives the new setting 314 as transmitted by the registers 316. The dLev generator circuitry 318 may decode and/or perform digital-to-analog conversions. For instance, the digital code may be used to select a voltage level derived from a resistor ladder to generate a voltage level for dLev 320 that is then used directly or unrolled for use in the DQ receiver 62 as previously discussed.

In some embodiments, a die of the memory device 10 may include a self-calibration circuitry 200 shared among all DQs of the die. Alternatively, a die of the memory device 10 may include multiple self-calibration circuitries 200. For instance, in some embodiments, an instance of the self-calibration circuitry 200 may be added to each DQ or at least one instance of multiple instances of the self-calibration circuitry 200 may be shared between at least two DQs. The amount of self-calibration circuitries 200 in the memory device 10 may vary accordingly based on how many self-calibration/training operations are to be performed in parallel by each of the self-calibration circuitries 200. If the self-calibration circuitry 200 is to be shared among DQs, the memory device 10 may be supplemented with multiplexers to inputs/outputs of the self-calibration circuitry 200 to direct signals to the proper locations. In certain embodiments, one DFE and a set of registers 316 may be used for each DQ regardless of the number of self-calibration circuitries deployed on a die. However, the dLev generator circuitry 318 may be dedicated to a single DQ or shared between multiple DQs.

The target levels (e.g., programmable reference voltages 194 and 195) used to provide a reference in error calculations may also be set by the DQ receiver 62. In some embodiments, the target levels may be determined based on either a received logic low or a received logic high. In a perfectly linear, time-invariant (LTI) system, determining a target level for the received logic low would also produce an accurate result for the received logic high case. In a nonlinear system, the results for the target levels may be different for the high and low cases, but this difference may be predictable based on input/output topology (e.g., channel termination to ground, etc.). Indeed, the determination of the target levels may be set for the worst case between the high and low cases.

Alternatively, the target levels may be calibrated based on both the high and low values. These may be used sequentially/alternatingly or simultaneously/in parallel. The sequential training evaluation may take longer than parallel determinations and uses switching (e.g., multiplexers) and control mechanisms to control when switching is to occur. The simultaneous training may obviate the additional switching and control mechanisms with a reduced amount of time to find the target levels in exchange for the inclusion of an additional error latch (e.g., latch 120). Furthermore, target levels may be chosen based on one or the other calculated target levels as an offset from Vref, an average offset from Vref based on the calculated target levels or independent offsets (e.g., high value from high and low value from zero).

Furthermore, the step size signal 310 may be dynamic. A coarse-grained step (e.g., 5 mV) versus a fine-grained step (e.g., 1 mV) may provide a trade-off of accuracy with the fine-grained step and speed for the low-grained step. One mechanism may use both where a coarse-grained step is used until the decision to add or subtract in the adder/ subtractor circuitry 308 changes. After that point, fine-grained steps may be used to more accurately determine the correct target levels.

Other mechanisms to be used to reduce the duration for the process for determining the levels may include estimating a start point in the determination. For instance, lookup table(s) may store information to estimate the high and low target levels where the estimated levels are estimated from a known host drive strength and memory termination. Alternatively, these estimated levels may be calculated from the host drive strength and memory termination. By starting at an estimated endpoint multiple iterations of the search sweep during training may be eliminated.

The received data pattern used in the self-calibration may be known or unknown. Furthermore, the data pattern may be continuous or bursty. How to analyze this data may change based on these conditions. For instance, if evaluating n-of-every-m-bits, the memory device 10/host device 47 may select a pattern to minimize the influence of yet-to-be-corrected intersymbol interference (ISI). For example, the used bits may have no transition just before or after the bit for x number of bits. Additionally or alternatively, the memory device 10 may skip x number of bits in a burst to avoid artifacts of channel/circuit settling time. Additionally or alternatively, if finding the high target (or low target) level, the host device 47 may send all ones (or zeros) or long strings of ones (or zeros) to speed up the process and reduce the impact of variation around the true high and low signal levels. The long strings may be at least as long as the number of DFE taps or a known channel response.

Similar to how the target levels are determined, the tap coefficients may be trained. In some embodiments, the tap coefficients may be determined based on either a received logic low or a received logic high. However, signal asymmetry may make determinations solutions sub-optimal. Additionally or alternatively, the coefficients may instead be made for an average of both high and low values. This solution may be more complex with more circuitry but may at least partially mitigate error in signal asymmetry. Additionally or alternatively, determining independent coefficients based on each high and low may include even more circuitry but may more fully account for signal asymmetry.

Furthermore, the step size signal 310 may be dynamic. A coarse-grained step (e.g., 5 mV) versus a fine-grained step (e.g., 1 mV) may provide a trade-off of accuracy with the fine-grained step and speed for the low-grained step. One mechanism may use both where a coarse-grained step is used until the decision to add or subtract in the adder/subtractor circuitry 308 changes. After that point, fine-grained steps may be used to more accurately determine the correct tap coefficients.

The "target level" determination previously discussed may set the target levels near the mode of the high or low incoming signal levels. As a result, tuning the DFE tap coefficients based on these targets may leave excess margin that may be utilized more efficiently. One option is to train the DFE tap coefficients based on the initial target levels, and then iteratively increase the separation between the high and low target levels. Additionally or alternatively, the tap coefficients may be retrained at each step. Additionally or alternatively, the DFE tap coefficients based on the initial target levels and then re-train the target levels with equalization enabled. This methodology may produce less variation in the high and low received and equalized signal levels pushing the high and low target levels toward their ideal location. Could loop on this iterative process until the target level no longer adjusts between iterations.

As previously noted, although DFEs are generally discussed, other equalizers may be tuned as long as a causal relationship can be identified between error and tuning knobs. For example, the zero or peaking frequencies in a Continuous-time Linear Equalizer CTLE or tap coefficients in a Feed-forward Equalizer FFE may be manipulated similar to the techniques discussed herein.

Figure 10:
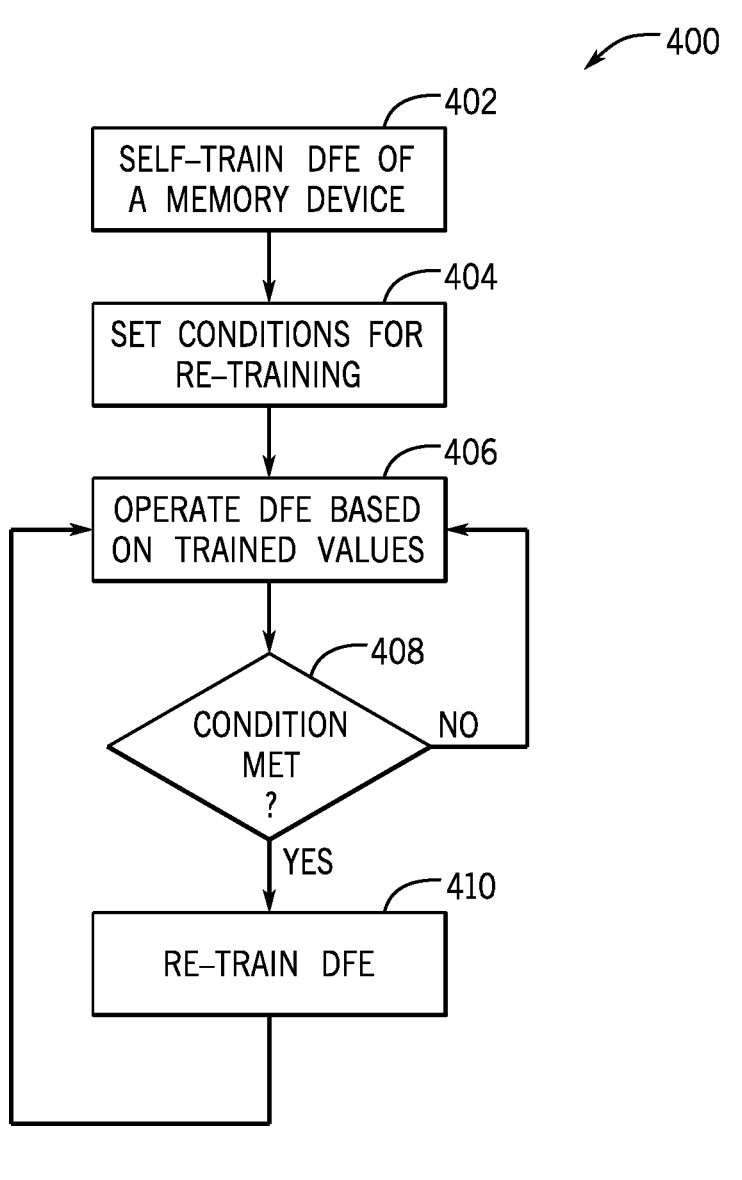
FIG. 10 illustrated a flow diagram of a process for performing self-calibration using the self-calibration circuitry of FIG. 9, according to an embodiment of the present disclosure.

Since an electrical/thermal environment in which the memory device 10 is deployed may change over time, the target levels and/or the DFE tap coefficients may be warranted over time using re-training. FIG. 10 shows a process 400 that may be used in re-training the memory device 10 using self-training/self-calibration. As illustrated, the DFE of the memory device 10 is self-trained (block 402). Such training may include self-training that is initiated by the host device 47 and performed as previously discussed with the host device 47 being uninvolved with, ignorant of, and/or not supervising self-training or re-training. Additionally or alternatively, the self-training may be enabled as part of/following initialization of the memory device 10. The training may continue until a done signal is returned to the host device 47, such as when the bit counter 304 has reached the end threshold value. Additionally or alternatively, the training may stop after a duration of training has passed.

The host device 47 may also select from preset training conditions that define conditions for re-training (block 404). These conditions may be set and/or reset based on application-specific power/performance trade-offs that may be known to the host device 47. The condition may be that specific event triggers have occurred, such a monitored temperature crossing a threshold, a variation in voltage trending in a constant direction over a period of time, external stimuli (e.g., spread-spectrum clocking) and the like have occurred. In some embodiments, the condition may be that self-training is not disabled thereby enabling continuous testing (e.g., on non-enabled memory ranks). Additionally or alternatively, the condition may be that a duration has occurred since a last re-training has occurred. For instance, the memory device 10 may use an oscillator much slower than a speed of the internal clocks used for memory operations in the memory device. When the oscillator causes a pulse, the memory device 10 may re-train regardless of other monitored conditions. In other words, the re-training may be continuous, periodic, event-based, or a combination thereof.

The memory device 10 then operates the DFE based on the trained values (block 406). The trained values may include the target levels and/or the DFE tap coefficients. The memory device 10 may use monitoring circuitry/a state machine to determine whether those conditions are met (block 408). For instance, the memory device 10 may use temperature monitoring circuitry when the condition is that a monitored temperature has crossed a threshold. Additionally or alternatively, the memory device may use a counter that counts a number of cycles of the internal clock (or a slower clock) to determine whether sufficient time has elapsed since a last training to invoke a re-train operation. This counter may be reset each time that re-training has been completed. When the condition is met, the memory device re-trains the DFE (block 410).

As previously discussed, the memory interface of the memory device 10 may be bursty rather than continuous. Thus, the memory device 10 may utilize the digital averaging circuitry to account for the burstiness. The digital embodiment of the averaging circuitry 302 may be suitable for any circuitry that may use bursty data, such as DFE tap coefficient tuning, input-offset calibration, and the like.

Another mechanism for handling bursty data may include introducing a data preamble to aid in data settling prior to continued error evaluation. Typically, preambles may be limited to strobes (e.g., WCK or DQS depending on standard). If no preamble, the error evaluation may be explicitly delayed "n" number of bits to mitigate skew due to startup artifacts in the received signal. Thus, even though parked and un-parked bits of the same value may be different. The number may be set by the host device 47 and/or via fusing. Furthermore, n may be related to the number of DFE taps to make sure that the taps are populated before training.

As it may be inefficient to wait several cycles for the signal to settle, a unique "burst start" pattern of DFE coefficients may be enabled following gaps in data spanning more than a certain number of bits, such as gaps between write operations. After the number of cycles (e.g., the number of taps), the DFE reverts to a set of real-time-adapting coefficients. In other words, the DFE taps may be set to an initial pattern (e.g., 0000, 0101, 1111, etc.) to be used at the beginning of a burst.

To address variable "inter-amble" or "burst gap" between operations, the DQ receiver 62 may continue to shift the DFE history even when data is not being received. For example, an n-tap DFE could provide an internal trigger that is aligned with the strobe timing that continues even when there is no link activity to the host device 47. This internal trigger may maintain normal DFE function for up to n cycles when the number of inter-amble cycles exceeds the DFE tap count. After that, the DFE may be re-initiated for the beginning of a fresh burst. During such time, the internal strobing may be disabled to limit power usage during long gaps or periods of inactivity. Otherwise, the DFE coefficients are maintained as though the data had been all a set value (e.g., 0 or 1) and ready for the next burst at any intermediate cycle.

When the memory device 10 is symmetric with two or more memory ranks, at least some of the training may occur during normal operation. With balanced rank-to-rank layout, parasitics and termination, both enabled and disabled memory ranks may see the same signal and can therefore be continuously self-training. This continuous self-training may account for drifts in signal margin due to changing temperature or voltage or any other parameters. In other words, a disabled rank may use the data sent to the enabled rank to train. Therefore, the training portions may run simultaneously on disabled ranks while memory operations occur for the enabled ranks. In some embodiments, the memory device 10 may restrict termination changes during the training or for a duration after the training.

As used herein, training of the DFE may be performed with or without accessing the memory array of the memory device 10. For instance, training may be made using incoming data that is not actually stored in the memory array. For instance, if a non-targeted memory ranks may use data that is not stored in the memory array. Additional or alternatively, during self-training, the DFE may pull some data (e.g., data bits, configuration settings, thresholds, step sizes, etc.) from the memory array as part of the training/calibration.

In some embodiments, the techniques disclosed herein may use independent adjustable timing in DQS/WCK signal timing local to each data pin/DQ pad within the memory device 10 for sample-time optimization. As part of this adjustment, the host device 47 may skew write data prior to launch to compensate for mismatches in data routing, DQS/WCK routing mismatches, and/or variation in the memory device 10. The host device 47 may also adjust internal clock to optimize sample timing of read data as the data is received from the memory device 10. Furthermore, in some embodiments, the training/calibration techniques discussed herein may assume that the host device 47 has already trained the relative clock/strobe to data timing for optimal sample time at the data latch to get a starting point for the training. This assumption enables a rapid first-order sample timing to be established based on in-phase and out-of-phase aggressor impact on a victim line. This rapid first order timing may be achieved by applying a first pattern (e.g., 0101) to the victim line and applying a second pattern (e.g., 1010, 0101) to aggressor lines. These patterns may be received from the host device 47. The resulting edges of the data eye and the mean signal level may be determined using phase detection and signal averaging to initiate the training sequences discussed herein. In some embodiments, the signal averaging may occur after the target levels determination has been performed.

As may be appreciated from the previous discussion, the equalizer (e.g., DFE) may use a different number of taps than the number of phases. When the number of phases and taps are the same (e.g., 4), the correct number of bits used in the equalizer are inherently stored for use in the equalizer. However, if there are fewer phases than taps, the memory device 10 may buffer at least some bits to have sufficient bit history to provide for use in the equalizer. In other words, the memory device 10 may store the number of bits necessary to store sufficient bit history to meet the number of taps used in the equalizer.

Additionally, although the application discusses using single-ended signaling, the memory device 10 may use differential signaling for in place of and/or in addition to any of the single-ended signaling techniques discussed herein.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform] ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
an input pin configured to receive data bits from a host device;
a plurality of latch circuitries comprising latches configured to latch the data bits for placement on an internal data bus and to at least partially implement an equalizer to aid in interpreting the received data bits, wherein the plurality of latch circuitries each corresponds to a phase of a plurality of phases of a clock received from the host device;
error evaluation circuitry comprising an error latch configured to latch a same bit as one of the latches of the plurality of latch circuitries in parallel with the one of the latches in the plurality of latch circuitries, wherein the number of bits latched in the error evaluation circuitry is fewer than the number of bits latched in the plurality of latch circuitries at one time; and self-calibration circuitry configured to:

receive a first output from the error evaluation circuitry resulting from latching of the same bit;

receive a second output from one of the latches of the plurality of latch circuitries resulting from the one of the latches latching the same bit;

determine an error correction reference voltage based at least in part on a comparison between the first output and the second output; and determine settings for the equalizer based at least in part on the comparison between the first output and the second output and using the error correction reference voltage.

2. The semiconductor device of claim 1, wherein the semiconductor device comprises a memory device.

3. The semiconductor device of claim 1, wherein the plurality of latch circuitries uses a data reference voltage to latch the data bits, and the data reference voltage is different than the error correction reference voltage.

4. The semiconductor device of claim 3, wherein the plurality of latch circuitries comprise first and second latches and selection circuitry for each bit of the data bits where the first latch corresponds to a previous bit being a logic high and the second latch corresponds to the previous bit being a logic low, and the selection circuitry is configured to select between outputs of the first and second latches based on the value of the previous bit.

5. The semiconductor device of claim 4, wherein the error evaluation circuitry comprises an additional error latch configured to latch the same bit and additional selection circuitry, where the first latch corresponds to a previous bit being a logic high and the second latch corresponds to the previous bit being a logic low, and the additional selection circuitry is configured to select between outputs of the error latch and the additional error latch based on the value of the previous bit.

6. The semiconductor device of claim 5, wherein the error latch is configured to utilize a first reference voltage corresponding to the previous bit being a logic high, the additional error latch is configured to utilize a second reference voltage corresponding to the previous bit being a logic low, and the first reference voltage and the second reference voltage are based at least in part on the error correction reference voltage.

7. The semiconductor device of claim 1, comprising a deserializer configured to take the data bits sent in a serial format from the host device and arrange the data bits in a parallel format for transportation via a data bus.

8. The semiconductor device of claim 1, wherein the settings of the equalizer are to be used for a subsequent bit of the received data bits after the same bit, and previous settings of the equalizer based on previous bits are to be used for the same bit.

9. The semiconductor device of claim 1, comprising a plurality of error evaluation circuitries each corresponding to a respective latch circuitry of the plurality of latch circuitries, and each of the received data bits is configured to be captured in both a respective error evaluation circuitry of the plurality of error evaluation circuitries and a respective latch circuitry of the plurality of latch circuitries.

10. The semiconductor device of claim 1, wherein the semiconductor device comprises a pre-amp to amplify the received data bits before transmission to the plurality of latch circuitries.

11. A method comprising:

receiving data bits at an input pin of a semiconductor device from a host device;

latching the received data bits in a plurality of latch circuitries of the semiconductor device that at least partially implements an equalizer to aid in interpreting the received data bits;

transmitting, from the plurality of latch circuitries and to self-calibration circuitry of the semiconductor device, a first latched bit latched from a first received bit of the received bits;

latching the first received bit in an error evaluation latch of error evaluation circuitry of the semiconductor device as a second latched bit;

transmitting the second latched bit from the error evaluation circuitry to the self-calibration circuitry;

determining an error correction reference voltage based at least in part on a comparison between the first latched bit and the second latched bit;

using the self-calibration circuitry to determine settings for the equalizer without involving the host device in determining the settings after the host device sends the data bits and based at least in part on the error correction reference voltage; and using the self-calibration circuitry to determine a first reference voltage that is based at least in part on a comparison of the first latched bit and the second latched bit, wherein latching the first received bit as the second latched bit comprises using the first reference voltage, and latching the first received bit as the first latched bit comprises using a second reference voltage.

12. The method of claim 11, wherein the equalizer comprises a decision feedback equalizer (DFE), and the settings comprise voltage levels or current levels associated with taps of the DFE.

13. The method of claim 12, wherein the settings comprise a location of a tap of the DFE in time.

14. A memory device, comprising:

an equalizer to aid in properly interpreting data bits received at the memory device from a host device, wherein the equalizer comprises:

a data latch configured to:

latch the data bits as latched data bits, wherein the data bits are configured to be received from the host device; and output the latched data bits based at least in part on a first reference voltage in relation to voltages of the respective data bits; and an error evaluation latch configured to:

latch the data bits as latched error bits in parallel with the data latch; and output the latched error bits based at least in part on a second reference voltage in relation to respective data bits;

self-calibration circuitry configured to:

receive the latched data bits and the latched error bits;

determine the second reference voltage for each data bit of the data bits based at least in part on a comparison between respective latched error bits and respective latched data bits received before the respective bit, wherein latching the data bits as the latched data bits comprises using the first reference voltage, and latching the error bits as the latched error bits comprises using the second reference voltage; and
determine settings for the equalizer based at least in part on the comparison.

15. The memory device of claim 14, wherein the equalizer comprises a plurality of data latches including the data latch and a plurality of error evaluation latches including the error evaluation latch, and there are equal numbers of latches in the plurality of data latches and the plurality of error evaluation latches.

16. The memory device of claim 14, comprising a plurality of self-calibration circuitries including the self-calibration circuitry.

17. The memory device of claim 16, comprising a plurality of data lines, wherein one of the self-calibration circuitries is dedicated to each data line of the plurality of data lines.

18. The memory device of claim 14, comprising a plurality of data lines, wherein the self-calibration circuitry is configured to be shared between the plurality of data lines.

19. The semiconductor device of claim 1, wherein the plurality of phases comprises four phases into which the clock is divided, and the number of bits latched into the plurality of latch circuitries at one time comprises four bits.

20. The semiconductor device of claim 19, wherein the error evaluation circuitry is configured to latch in a single bit at a time such that bits corresponding to three phases of the clock are not error evaluated in the error evaluation circuitry in each clock cycle.

* * * * *